United States Patent [19]
Shen

[11] Patent Number: 6,066,004
[45] Date of Patent: May 23, 2000

[54] LED LIGHT STRING STRUCTURE

[76] Inventor: Chien Fu Shen, No. 1, 154 Lane, Chang Shang Street, Hsinchu, Taiwan

[21] Appl. No.: 09/170,004

[22] Filed: Oct. 13, 1998

[51] Int. Cl.$^7$ ........................................................ H01J 9/03
[52] U.S. Cl. .......................... 439/617; 439/611; 439/692; 439/699.1; 439/699.2
[58] Field of Search ...................... 313/113, 317, 313/318.06, 318.07, 318.09, 318.1, 318.12; 324/414; 362/226, 227, 249, 353; 439/611, 617, 618, 660, 692, 699.1, 699.2

[56] References Cited

U.S. PATENT DOCUMENTS

| | | | |
|---|---|---|---|
| 4,675,575 | 6/1987 | Smith et al. | 315/185 S |
| 5,213,407 | 5/1993 | Eisenbraun | 362/123 |
| 5,368,503 | 11/1994 | Savage, Jr. | 439/502 |
| 5,408,764 | 4/1995 | Wut | 36/137 |

*Primary Examiner*—Cassandra Spyrou
*Assistant Examiner*—Craig Curtis
*Attorney, Agent, or Firm*—Rosenberg, Klein & Lee

[57] ABSTRACT

An LED light string structure is provided. The LED light string structure includes an LED (1) having conductive leads (12) projecting from one end. The leads (12) have an arcuate shape and make electrical contact with first and second terminals (31). The apices of the arcuate leads (12) act as both electrical contact points and as mechanical retention points.

1 Claim, 6 Drawing Sheets

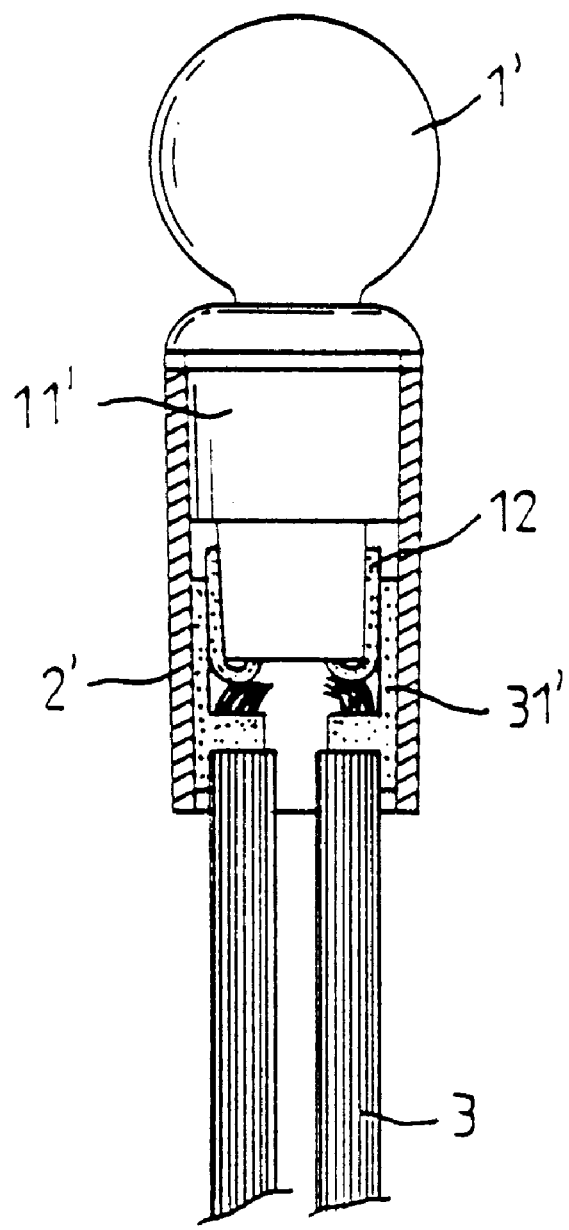
F I G. 6

LED LIGHT STRING STRUCTURE

BACKGROUND OF THE INVENTION

Owing to the fact that light emitting diodes (LEDs) save more electricity than conventional light bulbs and also generate less heat, LEDs have been widely used in Christmas decoration lamp strings. Most LED lamp string structures generally use a single LED to replace the conventional tungsten filament lamp and assemble the LED with attached lamp filaments in advance. The tails of the lamp filaments are then bent to make electrical contact with the lamp terminals and assembled in the interior of the lamp socket. Assembly of the conventional LED structure with the attached lamp filaments causes difficulty in the manufacturing process. The conducting filaments of LEDs have greater tensile strength than the conventional lamp filaments, therefore it is not beneficial to replace the original LED filaments in order to form the lamp string.

OBJECT OF THE INVENTION

Based on the failings of the conventional structure, the main purpose of the present invention is to provide a structure of an LED type Christmas lamp which includes an LED with lamp wicks, forming the entire body. This structure simplifies the production process and, due to the improved structure of the conductive leads, provides a more efficient and sturdier design. The structure and features of the present invention are described as follows:

BRIEF DESCRIPTION OF THE DRAWINGS

FIG. 6 is an exploded sectional view of the embodiment of FIG. 4.

DETAILED DESCRIPTION OF THE INVENTION

Figure 1:
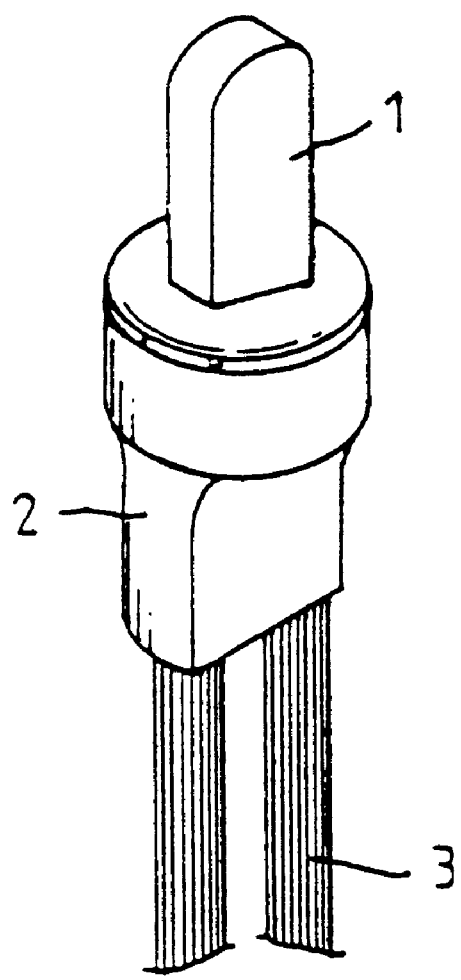
FIG. 1 is an assembled perspective view of the present invention.
Figure 2:
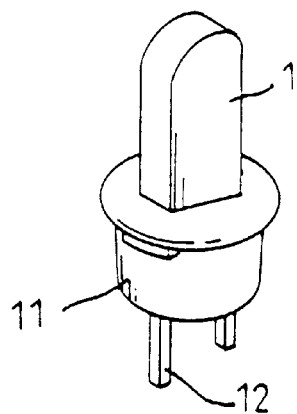
FIG. 2 is an exploded sectional view of the present invention.
Figure 2:
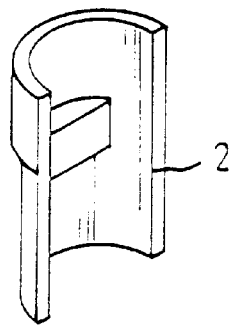
Figure 2:
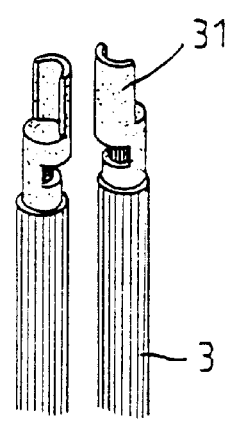
Figure 3:
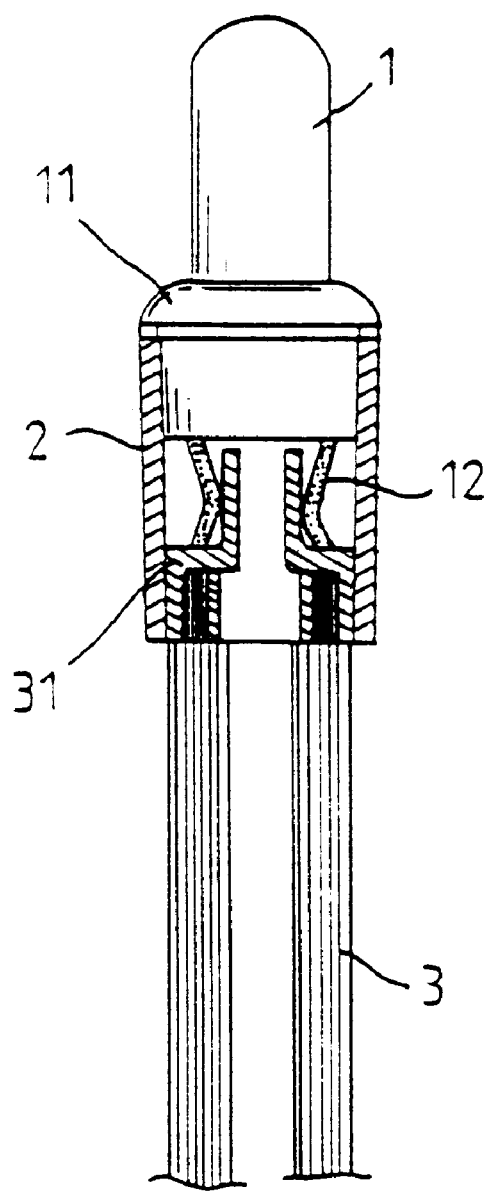
FIG. 3 is an assembled sectional view of the present invention.

Referring to FIGS. 1–3, the present invention includes an LED 1 with an affixed lamp wick 11, forming the complete lamp body. Conducting filaments 12 extend downward from a lower portion of lamp socket 2, such that the exterior of the lamp wick 11 can be positioned adjacent to the interior of the lamp socket 2 to form a close contact jointed structure. Terminals 31 are assembled on the upper ends of two electrically conductive wires 3, and are inserted into the lower end of the lamp socket 2. When the LED 1 and lamp wick 11 are assembled with the lamp socket 2, the two conducting filaments 12 are bent inwards towards terminals 31, as shown in FIG. 3, so that conducting filaments 12 make contact with terminals 31 on both the lower and upper portions of terminals 31. Thus, the overall electrical contact between the conducting filaments 12 and terminals 31 is increased with respect to the conventional lamp string structure, increasing the effectiveness and efficiency of the system.

Figure 4:
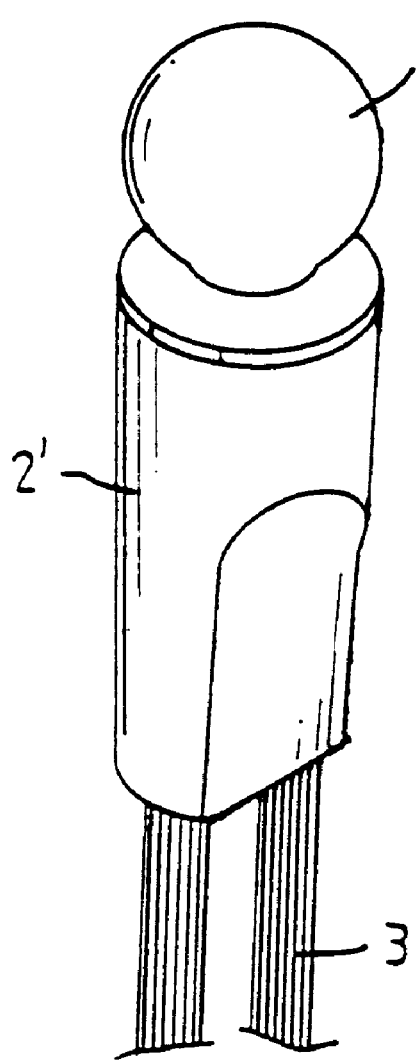
FIG. 4 is a perspective view of a second embodiment of the present invention.
Figure 5:
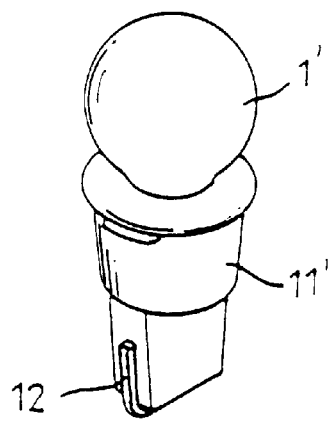
FIG. 5 is an exploded perspective view of the embodiment of FIG. 4.
Figure 5:
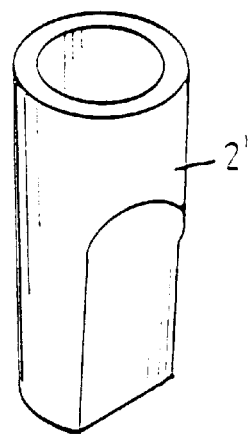
Figure 5:
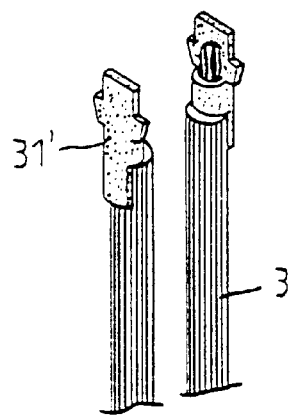

FIGS. 4–6 illustrate a second embodiment of the present invention which includes LED 1' and lamp wick 11' formed as any desired shape and as the whole body of the structure. This structure may be applied to conventional lamp sockets 2' and plate shaped terminals 31', and has the increased efficiency and effectiveness over conventional systems.

What is claimed is:

1. An LED light string structure comprising:

a light emitting diode having first and second electrical leads projecting therefrom, said electrical leads forming arcuately contoured members, each of sail arcuately contoured members having a fixed end, a free end and an apex formed therebetween;

first and second electrical terminals, each of said electrical terminals having a lateral conductive section and a transverse conductive section extending substantially normal to said lateral conductive section;

a cylindrical socket having first and second open ends, said first open end formed to receive said first and second electrical leads and said second open end formed to receive said first and second electrical terminals such that said first and said second apices of said first and second arcuate members are in electrical contact with said first and said second transverse conductive sections and said first and second free ends of said first and said second arcuately contoured members are in electrical contact with said first and said second lateral conductive sections.

* * * * *